United States Patent [19]

Chandra et al.

[11] 4,174,538

[45] Nov. 13, 1979

[54] TWO-DIMENSIONAL BUBBLE DOMAIN MEMORY

[75] Inventors: Ashok K. Chandra; Hsu Chang, both of Yorktown Heights; Chak-Kuen Wong, Briarcliff Manor, all of N.Y.

[73] Assignee: International Business Machines Corporation, Armonk, N.Y.

[21] Appl. No.: 866,194

[22] Filed: Dec. 30, 1977

[51] Int. Cl.² ............................................. G11C 19/08
[52] U.S. Cl. ........................................ 365/2; 365/24; 365/39; 365/17
[58] Field of Search ............... 365/2, 8, 17, 24, 36, 365/41

[56] References Cited

U.S. PATENT DOCUMENTS

| | | | |
|---|---|---|---|
| 3,703,712 | 11/1972 | Bobeck et al. | 365/2 |
| 3,753,253 | 8/1973 | Smith | 365/2 |
| 3,858,189 | 12/1974 | Beausoleil et al. | 365/8 |
| 3,996,573 | 12/1976 | Singh | 365/36 |

*Primary Examiner*—James W. Moffitt
*Attorney, Agent, or Firm*—Jackson E. Stanland

[57] ABSTRACT

A two-dimensional storage system having two dimensional access is described which offers advantages of speed and effective utilization of available storage area. The system is comprised of a plurality of bubble domain storage arrays, each of which has means therein for moving bubble domains in two dimensions. For instance, in each storage array bubbles can be moved either right-left or up-down. A functional area is provided between adjacent storage arrays to accommodate bubble movement to perform read, write, and clear functions and possibly logic functions. In one embodiment, the functional areas are comprised of sensors which simultaneously function as translation elements to map the information in one storage array into an adjacent array. Magnetic bubble domain sensors are provided for detecting bubble domains moved in one or two dimensions. For example, one sensor can be used to detect bubble domains moving right-left while another sensor is used to detect bubble domains moving up-down. Buffer regions are provided around the storage arrays to enable information to be moved in two dimensions in order to select any information within any selected storage array.

17 Claims, 17 Drawing Figures

TWO-DIMENSIONAL BUBBLE DOMAIN MEMORY

BACKGROUND OF THE INVENTION

1. Field of the Invention

This invention describes a bubble domain system in which information can be stored in two dimensions, with all four directions of motion possible to allow continuous accessing of contiguous information, and more particularly to a two-dimensional storage-two-dimensional accessing technique.

2. Description of the Prior Art

In the bubble domain technology, several techniques are shown for making bi-directional bubble domain shift registers. One such technique is described in U.S. Pat. No. 3,797,002 which shows a bubble domain shift register capable of being accessed at either end of the register.

Other bubble domain propagation schemes show circuits for moving bubble domains in two dimensions. One such scheme is shown in IBM Technical Disclosure Bulletin, Volume 18, No. 11, April 1976, at p. 3804. In that publication, permalloy overlay patterns are shown for moving bubble domains in either the x or y direction, depending upon the magnetic field used to move the bubble domains. Other references generally dealing with two-dimensional bubble domain shift registers are IEEE Transactions on Magnetics, Volume MAG-8, pp. 367-369, September 1972, and U.S. Pat. Nos. 3,723,985; 3,460,116; and 3,534,346. In particular, U.S. Pat. No. 3,723,985 discloses an electrically controllable bubble transfer circuit located at the intersection of plural magnetic domain field access propagation paths. A plurality of such path intersections are interconnected to form row and column shift registers of a two-dimensional shift register. All of the transfer circuits are connected to be driven together to realize propagation in two different directions in each field access cycle.

While the prior art does describe the use of two-dimensional shift registers for information storage in a bubble memory, the art does not describe two-dimensional accessing techniques combined with two-dimensional storage. Further, the prior art does not show techniques for permitting high speed accessing at the same data rate in both the x and y directions of a two-dimensional storage system. Moreover, the prior art does not show techniques for accessing information continuously along an arbitrary locus in the x-y storage plane.

In order to provide a two-dimensional bubble storage system having two dimensional access to information therein, where high speed accessing can occur at the same rate in the x and y directions, the present invention uses two-dimensional storage and two-dimensional propagation of bubbles, together with bubble sensors which are distributed to allow detection of data streams in two dimensions. Means are provided to facilitate sharing of interconnections and circuits so that fast access will be provided without increasing the need for electrical paths or peripheral circuits. Further, this system will provide a continuous scan of data in a two-dimensional data locus.

Accordingly, it is a primary object of the present invention to provide an improved bubble domain storage system having both two-dimensional data storage and two-dimensional data accessing.

It is another object of the present invention to provide a two-dimensional data storage, two-dimensional data access system in which high data rates can be achieved in both dimensions.

It is another object of the present invention to provide a bubble domain storage array having rapid access in the x and y directions, where data access is more rapid than in conventional bubble domain shift registers.

It is yet another object of the present invention to provide a two-dimensional bubble storage system which allows block access of data in two dimensions.

It is a further object of the present invention to provide a two-dimensional bubble domain storage system comprised of a plurality of bubble domain storage arrays wherein information is readily translated between adjacent storage arrays.

It is another object of the present invention to provide an improved bubble domain storage system having two-dimensional storage and two-dimensional data accessing, wherein bubble domain write, read, clear, and annihilate circuits are distributed to serve a plurality of bi-directional, two-dimensional bubble storage registers.

BRIEF SUMMARY OF THE INVENTION

A magnetic bubble domain structure is provided which stores information in two dimensions and which accesses the stored information in two dimensions also. Thus, bubble domains can be moved in the x and y directions as well as along any locus in the xy plane; and can be detected in both of these directions. This allows many applications in addition to storage, such as pattern processing and matrix multiplication.

The bubble domain chip is comprised of a plurality of bubble domain storage arrays. Each array comprises propagation means for moving bubble domains in two dimensions within the array. Located between each of the arrays is a means for parallel transmission of bubble domains from one array to the adjacent array. An embodiment is shown where parallel compressors are used to translate information from one storage to the other in instantaneous fashion. The compressors can also be configured to provide detection of the bubble domains. Thus, from an organizational standpoint, a plurality of bubble storage arrays is provided between which logical arrays are used to accommodate the movement of information into and out of the storage arrays and for writing, clearing and sensing of selected information.

Sensors are provided for detecting bubble domains moving in two dimensions. As an example, one sensor provides detection of bubble domains moving right-left, while another sensor provides detection of bubble domains moving up-down. Pairs of these sensors are provided between a plurality of storage arrays. In the embodiments shown, one pair of sensors is provided at the center of each group of four storage arrays. This provides rapid reading of information in both the x and y directions. Of course, four sensors can be provided per array for slightly higher access speed. The sensors can be arranged according to a coincident selection scheme to limit the number of interconnections in circuits.

These and other objects, features, and advantages will be more apparent from the following more particular description of the preferred embodiments.

BRIEF DESCRIPTION OF THE DRAWINGS

FIG. 11A shows the direction of movement of bubble domains by the structure of FIG. 11A, in response to difference sequences of field H.

DETAILED DESCRIPTION OF THE PREFERRED EMBODIMENTS

Figure 1:
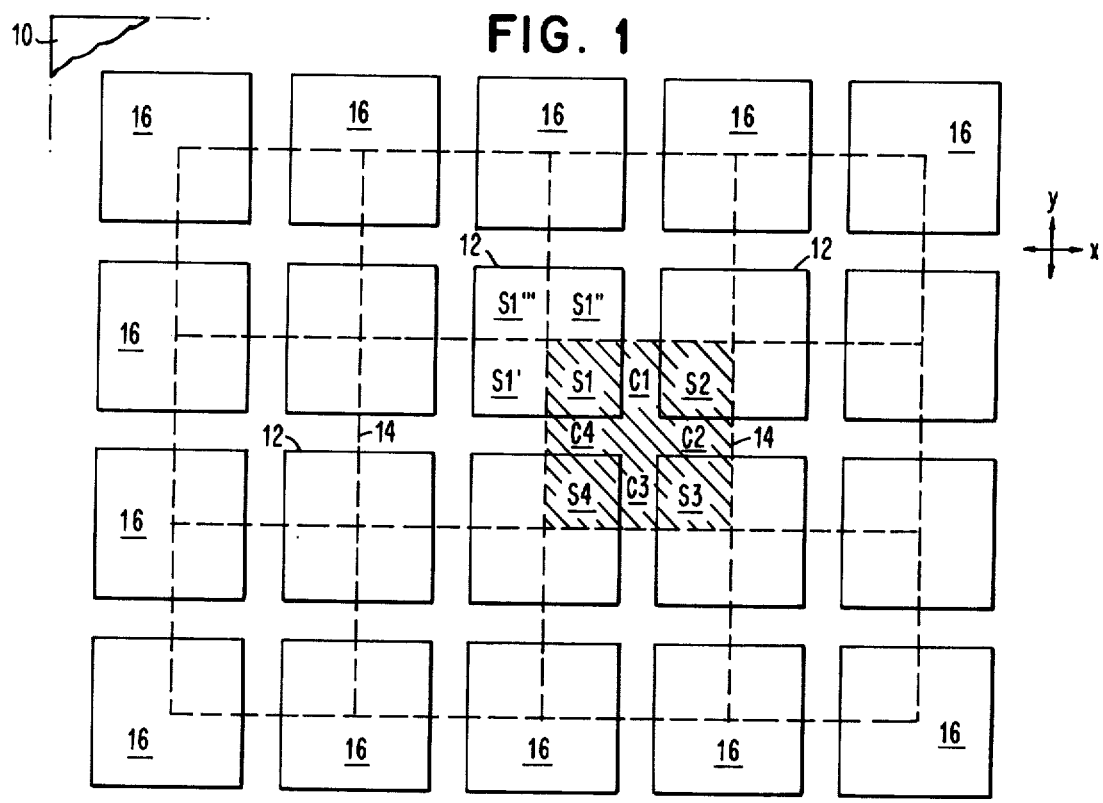
FIG. 1 is an illustration of the functional organization of this storage device, showing a plurality of storage arrays arranged in a matrix and a plurality of logical arrays coupling the storage arrays.
Figure 2:
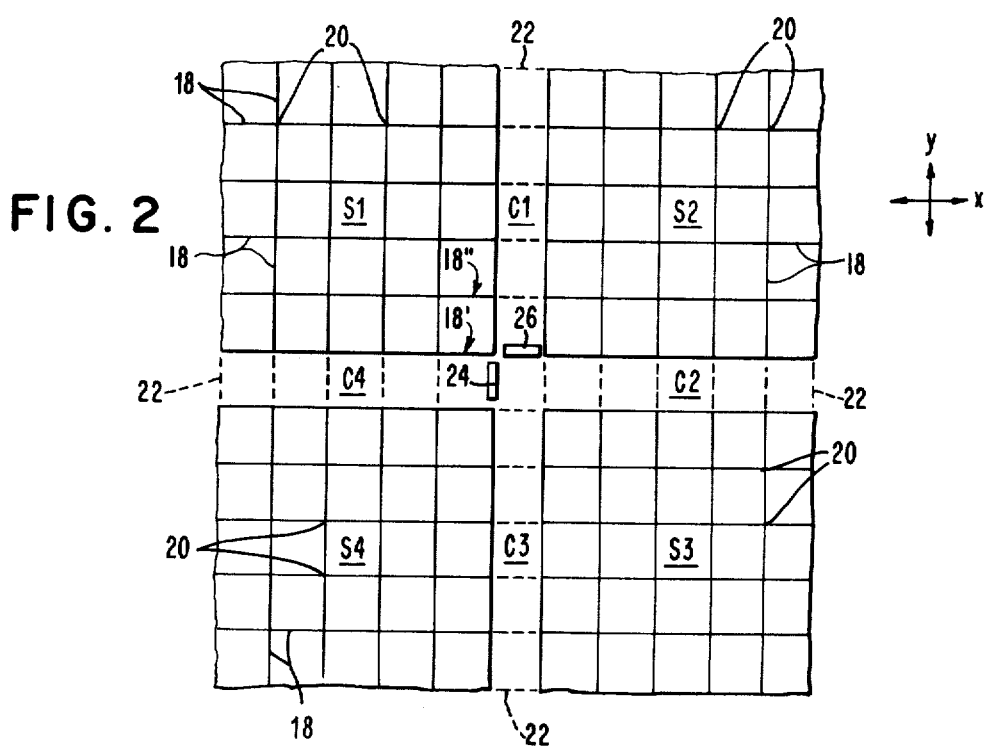
FIG. 2 shows portions of four storage arrays from FIG. 1, and illustrates the functional blocks within the organization of FIG. 1.

FUNCTIONAL ORGANIZATION (FIGS. 1 and 2)

These figures illustrate the functional organization of the two-dimensional storage, two-dimensional access bubble system of this invention. This portion of the specification will be directed to the organization of the storage system while the remaining portions of the specification will be directed to the hardware embodiments for performing these functions.

In more detail, a substrate 10 comprises a magnetic medium in which bubble domains can be moved. Examples of such a medium include magnetic garnets and amorphous magnetic materials, as well as any other material which will support stable magnetic bubble domains therein. The substrate 10 has components thereon (not shown) which are organized in a matrix in x and y directions as illustrated by the squares in this drawing. The solid line squares 12 represent storage means containing a physical array of bubble domains. That is, the squares 12 include structure for storing and propagating magnetic bubble domains. As will be seen later, each square 12 contains means for moving bubble domains in two dimensions, as for example in the x and y directions.

The squares 14, denoted by the dashed lines, indicate logical arrays. These logical arrays intertwine the various storage squares 12. As will be seen, they are used to move magnetic bubble domains between storage sites represented by the squares 12, and for performing various functions. A logical array contains a functional area in the center which includes read, write and clear facilities and possibly data manipulation and logic elements. The functional area serves the four quadratures of storage arrays when data are being propagated over this area.

The outside regions of the storage squares located around the periphery of the entire storage system are buffer stores 16. They are used to accommodate movement of bubble domains in either the x or y directions so that a bubble domain in any of the storage squares 12 can be moved half of the width of the square in either the x or y directions. This allows all of the information in the storage system to be translated either up-down or right-left over the functional area (for data access).

The crosshatched portion (FIG. 1) in the center of the system is used to explain the organization of the system. In this crosshatched portion, four portions S1-S4 of four storage arrays 12 are shown. The regions between these storage arrays are in the logical array 14, and comprise four groups of compressors C1-C4. For example, compressor C1 is used for translation of information in the x direction between storage areas S1 and S2, while compressor C2 is used to translate information in the y direction between storage areas S2 and S3. Cross-over of data along the compressor channels in substantially instantaneous. Thus, bubble domain information in storage area S1 can be translated to the right to storage area S2, or can be translated in the y direction to storage area S4. The information in area S1 can also be translated to the left to storage area S1' or upwardly to storage area S1''. Movement in two dimensions is used to bring information from S1 to S1'''.

FIG. 2 shows in more detail the crosshatched region of FIG. 1. In this FIG., storage areas S1-S4 are shown, with broken lines along the edges of these storage areas indicating that they are only portions of larger storage arrays 12 (FIG. 1). In each storage area S1-S4, the solid lines 18 represent bubble domain shift registers, along which bubble domains can be moved. A site 20 of bubble domain storage is the intersection of x and y solid lines 18. Thus, each storage area S1-S4 contains storage registers for moving bubble domains in the x and y directions. This provides two-dimensional bubble motion in each storage area.

The dashed lines 22 between each of the adjacent storage areas S1-S4 represent translation circuits. These are the compressor arrays C1-C4 which are illustrated in FIG. 2 as well as in FIG. 1. They are conventional bubble domain compressors used for transferring information rapidly and accurately from one storage register to another. The concept of a bubble domain compressor is well known in the art, as can be seen by referring to U.S. Pat. No. 3,623,034.

Sensors 24 and 26 are used to detect information moving in two dimensions. For example, information moving downwardly from storage area S1 can be detected by sensor 24, while information moving to the right from storage area S1 to storage area S2 is detected by sensor 26. In order to detect the information in any register of a storage area, the information is moved in either the x or y (or both) direction past either sensor 24 or sensor 26. For example, information in the lowermost horizontal register of storage area S1, indicated by solid line 18', is moved to the right in the x direction in order to be detected by sensor 26. Information in the horizontal register represented by horizontal line 18" would be moved downwardly one position and then to the right to be detected by sensor 26. In a corresponding manner, information in any of the vertical shift registers (except the rightmost one) of storage area S1 would be moved to the right and then downwardly in order to be detected by sensor 24.

As a matter of fact, the above description conforms to the operation of conventional linear registers. In the present structure, it is perfectly conceivable to have any locus of data path in the x-y plane. The entire storage array can be moved following any trajectory and the data can be detected by either the horizontal or vertical sensor, depending on whether the data movement is in the x or the y direction.

From the foregoing, it is clear that this two-dimensional storage, two-dimensional access bubble system comprises a plurality of storage arrays arranged in a matrix where each of the storage arrays includes means for moving bubble domains in two dimensions. A translation means is located between adjacent storage arrays for translating information in one array to the bit positions in the adjacent array. In the examples shown, compressors provide instantaneous translation of information and, as will be seen later, can also be used to provide an amplified output signal. In addition, the structure includes sensors for bubble domains moved in both x and y directions and buffer regions around the periphery of the total storage area to accommodate the two-dimensional translation of information in the storage arrays.

STORAGE STRUCTURE (FIGS. 3, 3A, 4, 5 and 6)

Figures 3, 3A:
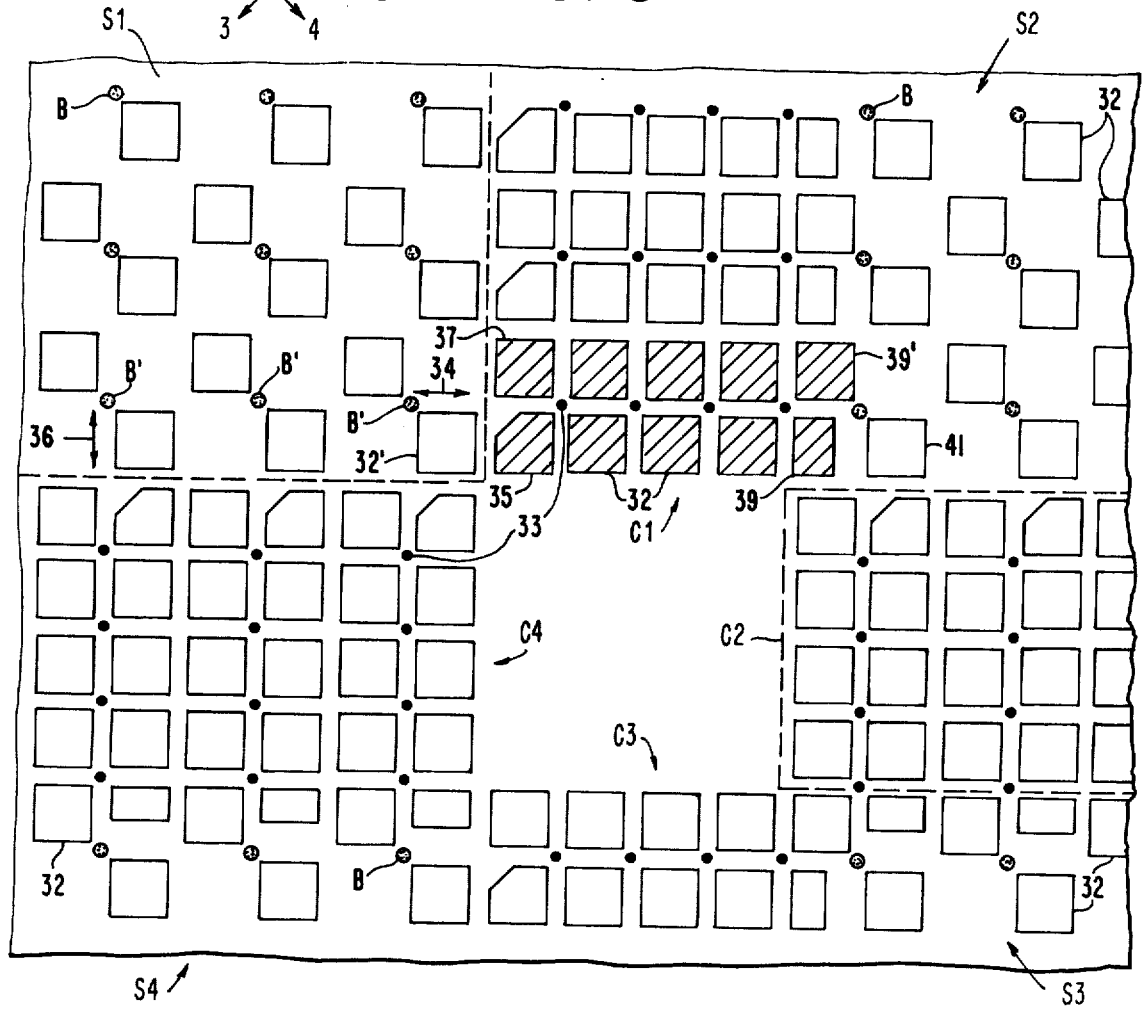
FIG. 3, including 3A, illustrates a propagation structure suitable for providing the storage and logical arrays of FIGS. 1 and 2, and more particularly shows a detailed circuit diagram for the functional blocks of FIG. 2.

FIG. 3 shows a portion of the storage areas S1-S4 and the compressor arrays C1-C4, and in particular shows the magnetic structure used to move the bubble domains B in response to the reorientation of the drive field H. Field H has the different orientations shown and is produced by the propagation field. Bubble domains B exist in the bubble domain material and are stabilized by the bias field $H_b$. Magnetic fields H and $H_b$ can be produced by conventional field sources which are well known in the art and will not be described in detail.

The generally square elements 32 are magnetic elements which are used to move bubble domains B in response to the reorientation of field H. As an example, elements 32 can be comprised of permalloy or any other magnetic material having magnetization substantially in the plane of the elements 32.

In the storage areas S1-S4, the magnetic propagation elements 32 are separated from one another and provide shift registers for moving the bubble domains either right-left or up-down. This motion will be explained more fully with respect to FIGS. 3A and 4.

In the compressor portion of the structure shown herein, the magnetic elements 32 are located closer to one another than they are in the storage regions S1-S4. The darkened small circle 33 between each group of magnetic elements 32 in the compressors indicates a site for an idler bubble. As is known, idler bubles continually circulate in their idling positions in a compressor until forced to move out of those positions by an incoming bubble.

In each of the storage areas, registers are provided for moving bubble domains both horizontally and vertically. For example, bubble domains B' are in a horizontal shaft register in storage area S1. These bubble domains can be moved in the directions indicated by arrow 34 with the proper sequence of field H as given by FIG. 3A. The stippled bubble domains in the leftmost column of bubble domains in storage area S1 are in a vertical shift register which is used to move them in directions given by arrow 36. This motion is in accordance with an appropriate field sequence as shown in FIG. 3A.

Each horizontal and vertical register in each of the storage areas is aligned with a register in the adjacent storage areas. Thus, information in any storage register can be translated to an aligned register in the adjacent storage area. This translation is achieved through use of the compressor arrays C1-C4. The compressors within the arrays C1-C4 are aligned with the shift registers in the adjacent storage areas so that bubble domains can be transferred in a straight line from one storage area to the other. For example, bubble domains B' in the lowermost horizontal register of S1 can be transferred to the right into storage area S2 via an aligned compressor whose bubble idling elements are indicated by the cross-hatched elements 32. Thus, if it is desired to transfer bubble domains B' in storage area S1 to storage area S2, the proper sequence of field H would be applied and the bubble domains B' would be translated via the shaded compressor to storage area S2. Whenever a bubble domain is put into the left-hand end of the shaded compressor, it forces bubble domains within the compressor out of their idle positions into bit positions in the aligned shift register in S2. If no bubble input were applied to the compressor (corresponding to a zero bit), the bubble domains in the idler positions of the compressor would remain there and no bubble domain would be moved into storage area S2.

Figure 4:
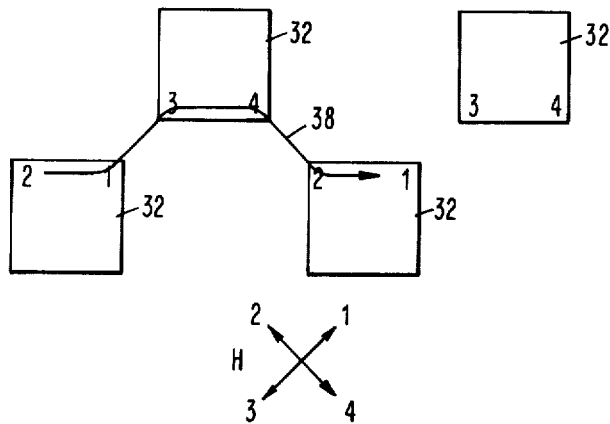
FIG. 4 shows a portion of the propagation structure of FIG. 3, and is used to illustrate the movement of magnetic bubble domains in response to the application of a reorienting magnetic field in the plane of the propagation elements.

Square 35 at the entry to the cross-hatched compressor has a "chipped" corner to facilitate entry of a bubble from storage area S1 into the compressor. A bubble domain will move from the top edge of square 32' (in S1) to the bottom edge of square 37 in the cross-hatched compressor. Thus, the wavy motion of the bubble domain (as indicated in FIG. 4) continues as it moves from S1 into the compressor. Since square 35 has a chipped corner, the bubble will see the attractive pull of the lower left-hand corner of square 37, and will move to that square.

The output end of the compressor contains a rectangles 39, rather than a square, in order to assist exit from the compressor to square 41 in S2. Remembering that the bubbles follow the wavy motion shown in FIG. 4 as they move through the compressor, a bubble will travel along the lower edge of square 39' and then move to the top edge of square 41 in S2. Since propagation element 39 is not as wide as the other squares in the compressor, the upper left corner of square 41 will be closer to the lower right-hand corner of square 39', and therefore will be more attractive to receiving a bubble which is to exit from the compressor. The rectangular elements in the other compressor regions serve the same function.

FIG. 3A illustrates the propagation directions followed by bubble domains in accordance with the applied field sequence. The arrows represent the direction the bubble domains would move with application of the associated field sequence.

FIG. 4 illustrates a portion of a bubble domain propagation structure which can be used to provide the horizontal and vertical shift registers in each storage area. The movement of a bubble domain to the right in accordance with a drive field (H) sequence of 2 1 3 4 2 1 3 4, etc. is shown in this FIG. As with FIG. 3, the individual magnetic propagation elements are labelled 32. The path followed by the bubble domain as field H reorients in the aforementioned sequence is indicated by the arrow 38. As is apparent, bubble domains move from one propagation element to the next and follow a generally undulating path in their movement.

Figure 5:
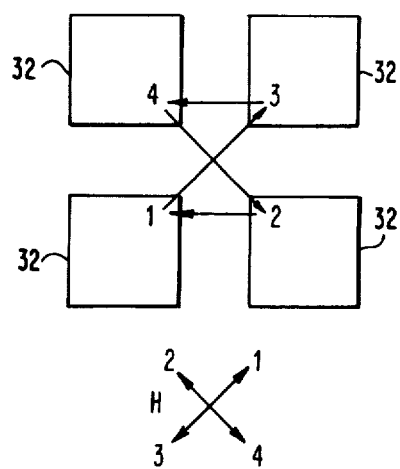
FIG. 5 shows a bubble domain idling structure and illustrates the operation of the idlers within the logical arrays of FIG. 3.

FIG. 5 illustrates a bubble idler for constantly recirculating magnetic bubble domains. In this structure, a bubble domain will move to consecutive pole positions 2-1-3-4-2, etc. as field H reorients with the field sequence 2 1 3 4 2 1 3 4, etc. As is apparent, this is the same field sequence used to move magnetic bubble domains to the right in the propagation structure of FIG. 4. By tracing through the path of bubble domains for each of the other field sequences shown in FIG. 3A, it will be seen that bubble domains in the idlers stay within the idlers regardless of which of these field sequences is applied. Thus, even though bubble domains propagate in either the x or y directions in the storage registers in accordance with the field sequences shown in FIG. 3A, bubble domains in the various idlers stay in the idlers and recirculate. It is only when a bubble domain enters an idler that the idler bubble is forced away from the idler. In accordance with the previous notation, the magnetic elements in the idler are also labelled 32.

Figure 6:
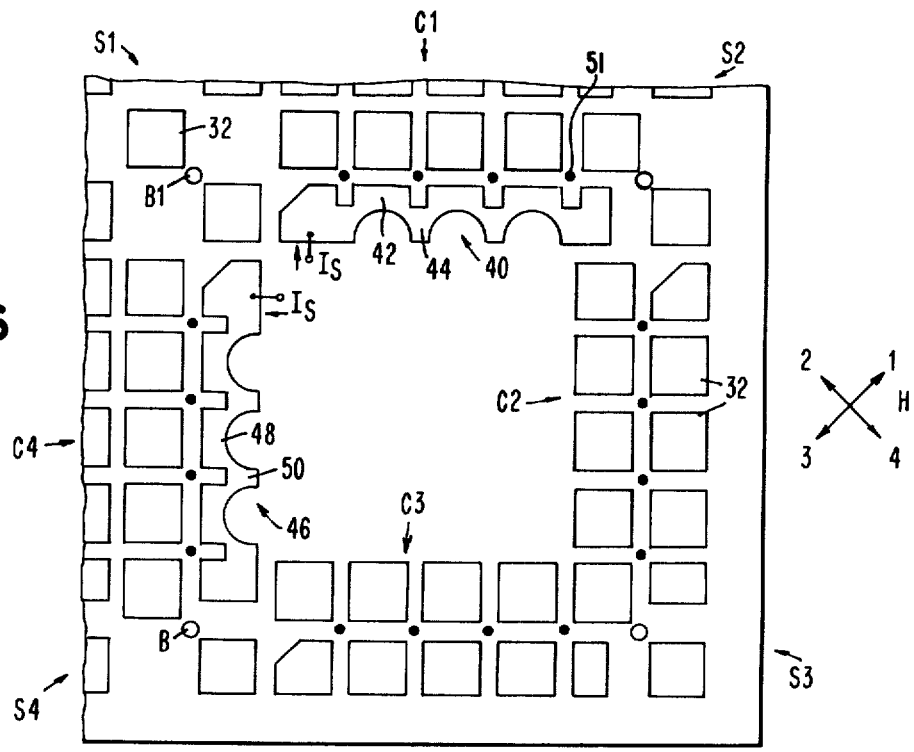
FIG. 6 shows a portion of the circuitry of FIG. 3, and illustrates the use of combined compressor/sensors for translation and sensing of information.

FIG. 6 shows a portion of the circuitry of FIG. 3, where combination compressor-sensors are used. In this embodiment, the horizontal magnetoresistive bubble sensor, generally designated 40, is comprised of narrow portions 42 and wide portions 44 (of, for example, NiFe). A current pulse $I_s$ flows through sensing element 40 when a bubble domain is to be sensed.

Vertical sensing element 46 is also comprised of narrow portions 48 and wide portions 50. The narrow portions are located between idle positions in each of the idlers (designated by the small darkened circles 51) while wide portions 50 are aligned generally with the idle positions of the bubble domains. A current $I_s$ is applied through sensing element 46 when a bubble is to be detected.

The operation of the sensors 40 and 46 is based on the compressor-amplifier of U.S. Pat. No. 3,858,189. Thus, when a bubble domain B1 moves to the right to enter compressor area C1, bubble domains in each of the idler positions (represented by the small darkened circles 51) are pushed to the right and pass the narrow portions 42 of the sensing element. Since these portions 42 are comprised of magnetoresistive material, a voltage pulse will be produced across the entire sensing element 40 if a current pulse $I_s$ flows through the sensing element at this time. The amount of output voltage will depend on the number of stages in the sensing element. Consequently, if many idle positions are provided, many bubbles will be moved past narrow magnetoresistive sensing portions 42 during the time sensing is performed. This will provide an amplified output signal even though only one bubble domain B1 entered the sensor-compressor.

The data bubble B1 can be either annihilated after sensing or returned to its storage location. Annihilation is easily accomplished by known techniques, such as current loops or magnetic elements, and structures are known for combining annihilators with bubble sensors (see U.S. Pat. No. 3,781,832 stretcher-sensor-buster).

In the operation of the sensor-compressor of FIG. 6, it is readily apparent that columns of bubble domains can be sensed by the vertical sensor 46, while horizontal rows of bubble domains can be sensed by the horizontal sensor 40. The parallel compressors between each pair of adjacent arrays facilitate parallel transmission of data from one storage array to another. Further, using a combination sensor-compressor provides amplification of the signal. Since a pair of sensors 40 and 46 is provided for each storage array, reading can be rapid in both the x and y directions. Of course, it is possible to have four sensors per array to double the data rate. (Access time remains the same since it is determined by the storage array size.) The sensors can be arranged according to coincident selection schemes to limit the number of interconnections and circuits, as is well known in the art.

ALTERNATIVE ACCESSING AND READING (FIGS. 7, 7A, 8, and 9)

These FIGS. are used to illustrate another structure suitable for two-dimensional accessing of information from the storage arrays S1-S4. In these embodiments, a sensing element is separate from the compressors and a transfer conductor is provided for selective transfer of bubble domains from a storage array to the adjacent compressor circuit.

Figure 7:
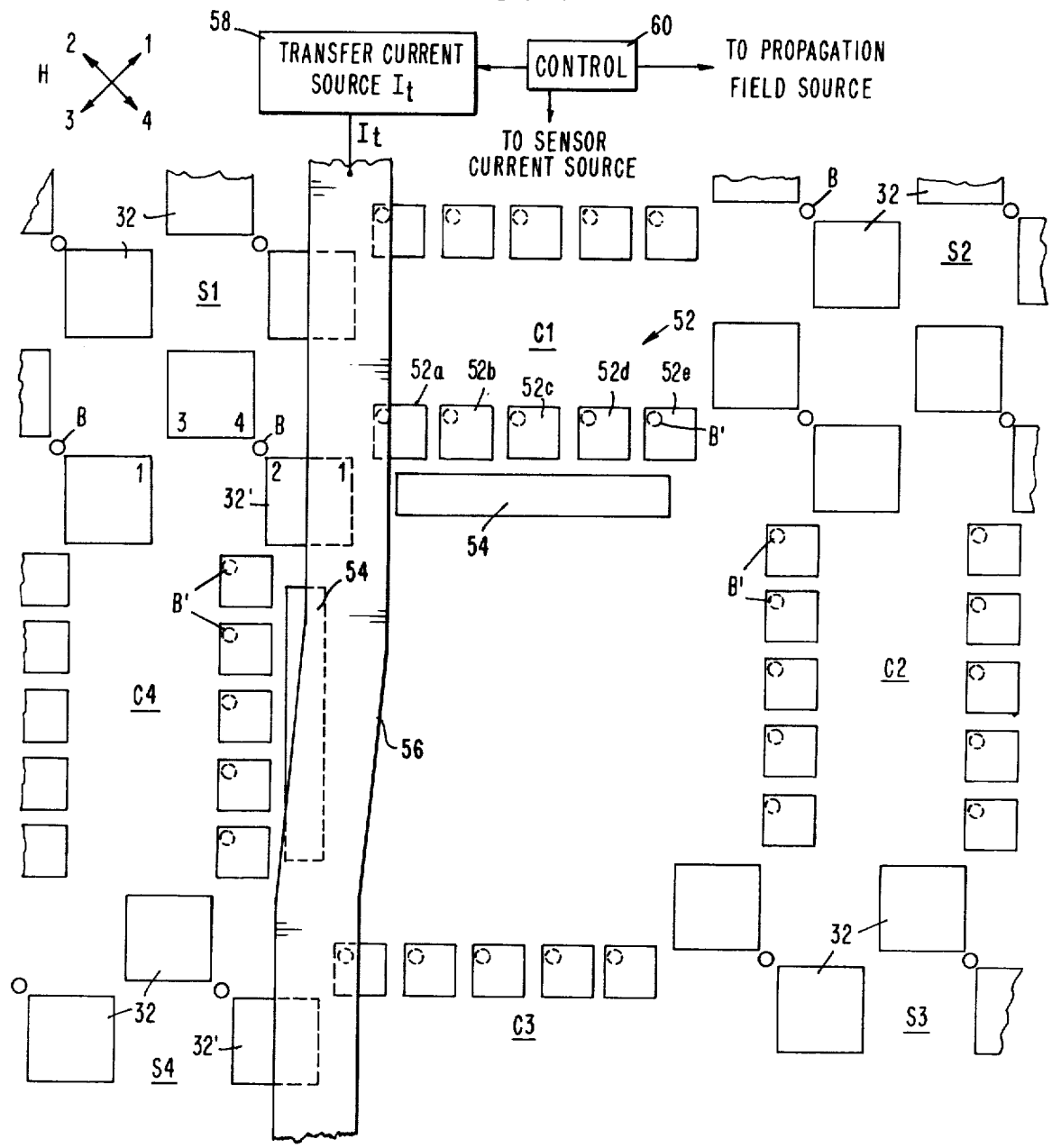
FIG. 7, including 7A, illustrates a variant of the structure of FIG. 3, where the bubble domain sensors are not part of the compressor structures.

Referring to FIG. 7, portions of the four storage areas S1-S4 are shown. Using the same reference numerals as were used previously, magnetic elements 32 in the storage areas are used to move bubble domains in x and y directions. Compressor circuits are located between adjacent storage areas and are used to translate information from shift registers in a storage area to the aligned shift registers in an adjacent storage area. The circuit of FIG. 7 differs from that of FIG. 3 in that the compressor circuits are comprised of idlers which use only one square magnetic element rather than four square magnetic elements as was previously shown. For example, compressor area C1 includes a compressor 52 which is comprised of individual magnetic elements 52A-52E. Each of the magnetic elements 52a-52e serve to idle bubble domains as field H reorients. This will be described more fully with respect to FIG. 8. Bubble domains in the compressors, such as compressor 52, are indicated by the dashed circles B', while bubble domains in the storage areas S1-S4 are indicated by the solid line circles B.

The sensing circuit of FIG. 7 is comprised of sensing elements 54. These sensing elements can be, for instance, comprised of permalloy and operated as magnetoresistive sensing elements. This is in accordance with the principles described in U.S. Pat. No. 3,691,540. For this purpose, sensing elements 54 will be electrically connected to a current source so that current will flow through them at the time sensing is to occur. The conductors required for this and the current source are not shown in this drawing for ease of illustration. In operation, the idler bubble domains B' follow different trajectories when they are idling and when they are compressing. Proper timing of the sensing current enables the detection of the difference. A voltage is developed across the sensing element due to the magnetic flux from the idler bubbles. Since many idler bubbles can be brought into close proximity to the sensing element, the signal is amplified from what it would be if only the data bubble B were sensed.

A conductor 56 is used to transfer bubble domains from storage areas S1 and S4 to the right to the aligned compressors C1 and C3. For example, conductor 56 is used to transfer bubble domains B in the lowermost horizontal shift register of storage area S1 to the right to compressor 52. The action of the conductor will be described in more detail with respect to FIG. 9.

Although only one conductor 56 is shown in FIG. 7, it will be appreciated that four such conductors are required to accommodate translation of bubble domains between each of the four storage areas S1–S4. For example, another vertically disposed conductor would be required for movement of bubble domains in storage areas S2 and S3 to the left. Further, two horizontal conductors would be required to move bubble domains upwardly or downwardly to the appropriate compressor circuits. These conductors 56 are electrically insulated from the conductors used to provide current to the magnetoresistive sensing elements 54.

FIG. 7A shows the directions of movement (denoted by the arrows) of the bubble domains in response to different sequences of the drive field H. For example, bubble domains move to the right in the positive x direction when the field (H) sequence is 2 1 3 4 2 1 3 4 . . . etc. When this field sequence is used, current flows in conductor 56 at field phase 3 in order to aid transfer of bubble domains from a storage area into the associated compressor circuit.

The transfer current $I_t$ is provided by transfer current source 58. This current is provided at the appropriate phase under control of a triggering pulse from control unit 60. Control 60 also provides a triggering pulse to the sensor current source which provides current through the sensing elements 54. Still further, the particular field sequence used for movement of domains in the x and y directions is determined by the control unit 60, which provides the appropriate control signals to a propagation field source used to produce field H. Synchronization of the various current and magnetic field sources is well known in the art and will not be described in detail here.

Figure 8:
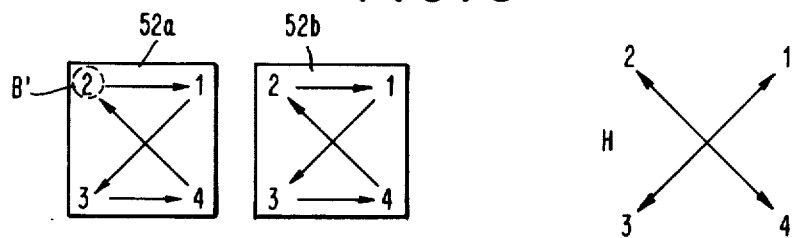
FIG. 8 shows a portion of the idling structure of FIG. 7, and is used to illustrate operation of that structure.
Figure 9:
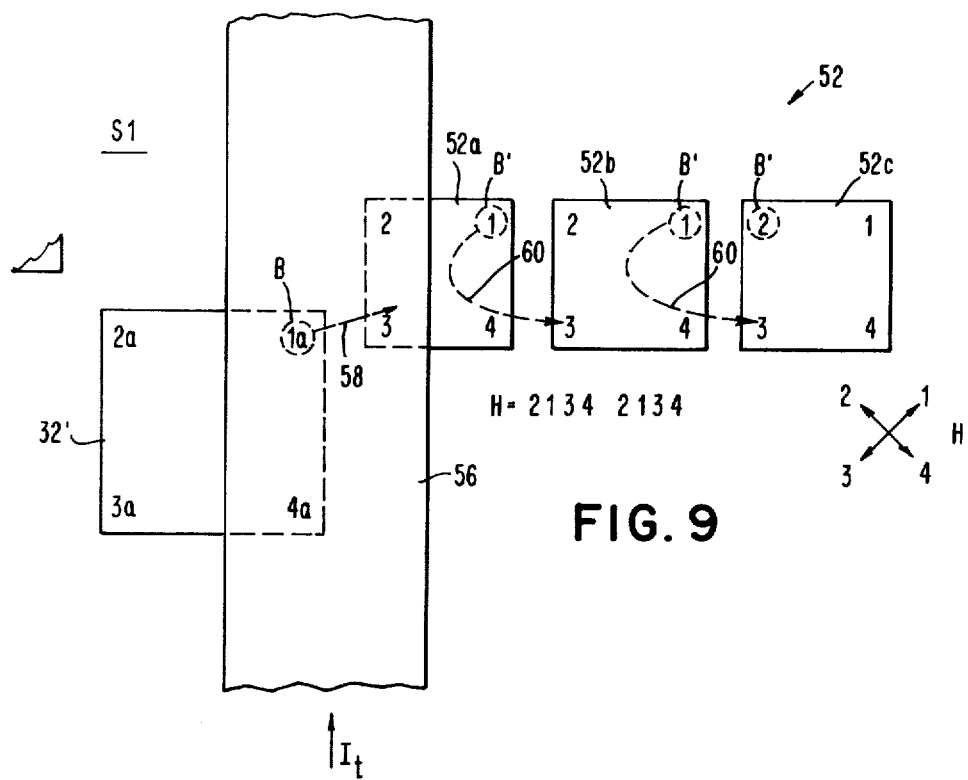
FIG. 9 shows another portion of the structure of FIG. 7, and is used to illustrate the transfer of information from a storage array to a compressor for delivery to a sensing element.

FIGS. 8 and 9 illustrate operation of the magnetic propagation elements and the transfer conductor in the circuit of FIG. 7. In particular, FIG. 8 shows two idler circuits, such as idlers 52a and 52b. These idler elements have a thickness which is sufficient to hold the bubble domains under the idlers as field H reorients. This distinguishes them from the idler elements 32 in FIG. 5, which are thinner and therefore do not hold the bubbles thereunder as field H reorients with the same sequence. For the magnetic field sequence 2 1 3 4 2 1 3 4, etc. it is apparent that a bubble domain B' will move to different corners of the magnetic elements without leaving the magnetic elements as field H continues its sequence. Since bubble domains B' prefer to stay under the thick magnetic elements 52a and 52b, they will just idle around the four corners of these elements as field H reorients in any sequence. However, if a bubble enters the compressor, bubbles in the idlers will be pushed to the adjacent idlers.

FIG. 9 shows a portion of the storage area S1 and in particular magnetic element 32' in this storage area (see FIG. 7 also). Idlers 52a, 52b, and 52c are also shown, as is transfer conductor 56. Bubble domains in compressor 52 are labelled B', while the bubble domain at position 1A of element 32' is labelled B.

The operation of the circuitry of FIG. 9 will now be explained. In the absence of a transfer current $I_t$ in conductor 56, bubble domain B at pole position 1a on element 32' tends to move to pole position 3a on that element. This is because the bubble B' on element 52a will prevent domain B on element 32' from moving across the gap to element 52a. Other bubbles in the shift register do not experience repulsion from B'.

However, if the usual magnetic field sequence is 2 1 3 4 2 1 3 4, etc., then the bubble domains in the storage areas would normally move to the right as shown in FIG. 7A. In order to insure that bubble domains B will move to the compressor 52, the conductor 56 is provided. By appying a transfer current $I_t$ between field phases 1 and 3, a bubble domain B at pole position 1a on element 32' will follow the path indicated by dashed line 58 to pole position 3 on element 52a. This in turn will move bubble domain B' on element 52a along a path indicated by dashed arrow 60 to pole position 3 on element 52b. Correspondingly, domain B' on element 52b will move to pole position 3 on element 52c. In this manner, the data bubble domain B has been reliably transferred to the compressor 52 and the information represented by it will be translated to storage area S2. Whenever bubbles are to be shifted in the x-direction, current $I_t$ is present while currents are not present in the vertically disposed transfer conductors. The reverse is true when bubbles are translated in the y-direction.

WRITE AND CLEAR (FIG. 10)

Figure 10:
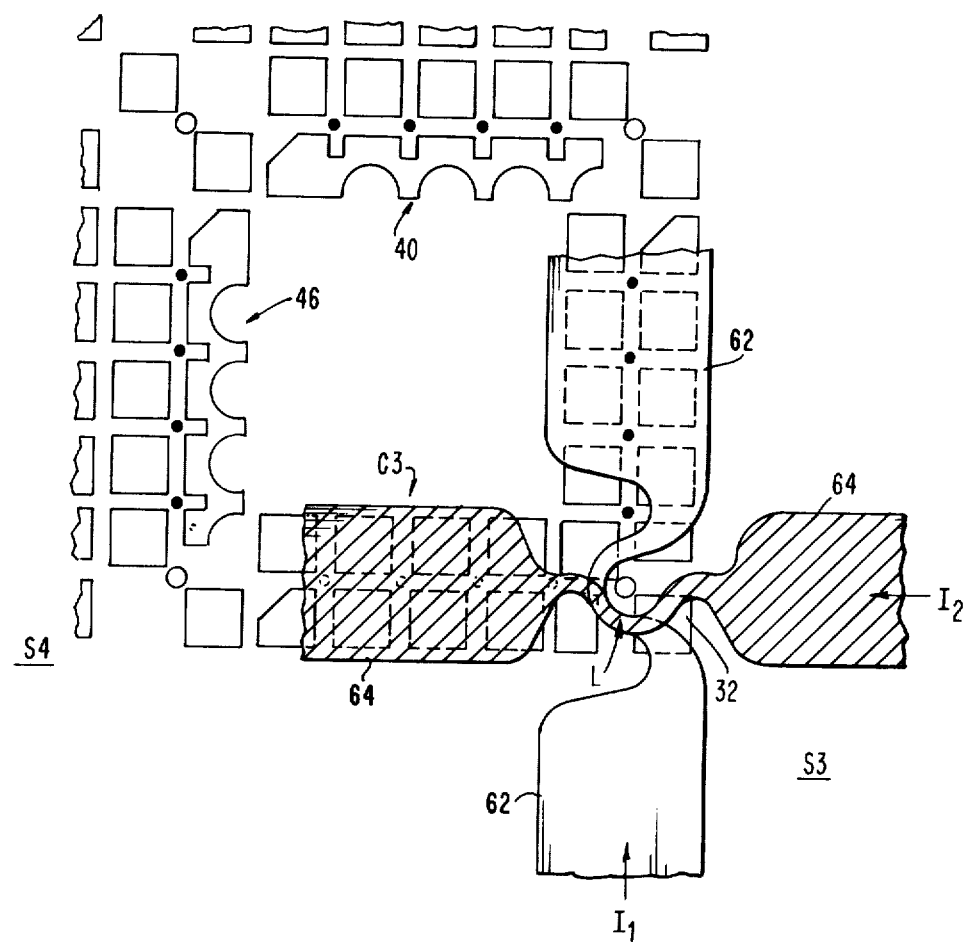
FIG. 10 is similar to FIG. 6, and shows the current-carrying conductors used for clearing information and writing information.

FIG. 10 is the same as FIG. 6, except that two conductors 62 and 64 have been added. These conductors are electrically insulated from one another and, to illustrate their spatial relationship, top conductor 64 is cross-hatched to make it more readily distinguishable from conductor 62 which is located below it. Conductors 62 and 64 have portions which are constricted in width in order to form a loop L which is located at approximately the upper left-hand corner of the first storage element 32 in storage area S3. Coincident currents $I_1$ and $I_2$ in conductors 62 and 64 respectively will produce a magnetic field in loop L of sufficient magnitude to annihilate domains therein. Correspondingly, coincident currents $I_1$ and $I_2$ of the opposite polarities will be sufficient to create a magnetic field which nucleates a domain within loop L.

In operation, bubble domains moving to the right from storage area S4 will be translated toward storage area S3 by compressor C3. When the domains are at the upper left-hand corner of magnetic element 32 in storage area S3, coincident currents $I_1$ and $I_2$ of the proper polarity will collapse these domains. New information can be rewritten merely by reversing the polarity of the currents $I_1$ and $I_2$. Depending upon the frequency of reorientation of field H and the bubble materials chosen, it may be possible to annihilate domains and create new domains without having to stop field H. If this is so, the annihilating currents $I_1 + I_2$ can be applied at field orientation 2, while the nucleating currents $-(I_1 + I_2)$ can also be applied during the same field orientation.

ALTERNATIVE PROPAGATION STRUCTURES

Figure 12:
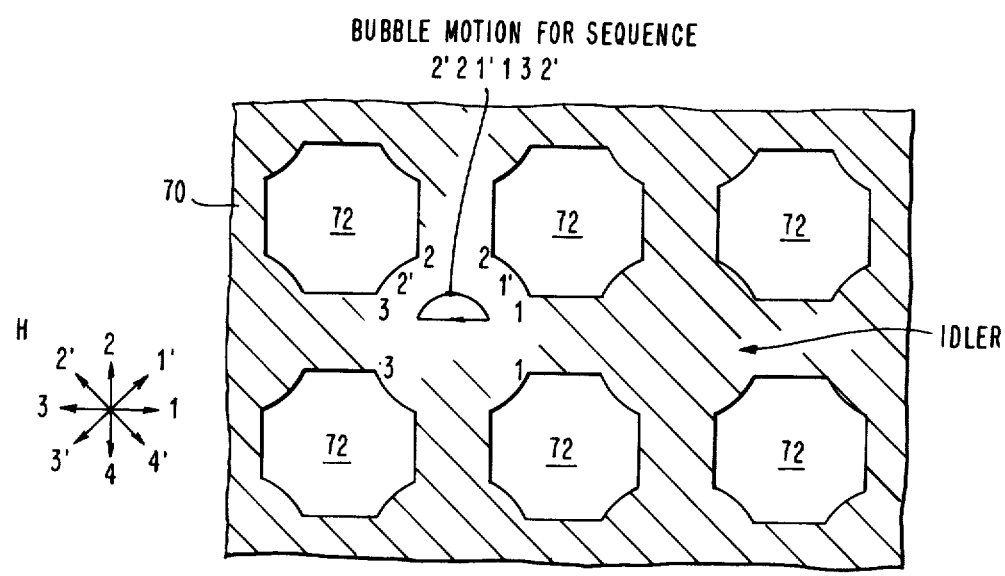
FIG. 12 shows a structure for idling bubble domains as field H reorients. This structure can be used to make a compressor circuit.
Figures 13, 13A:
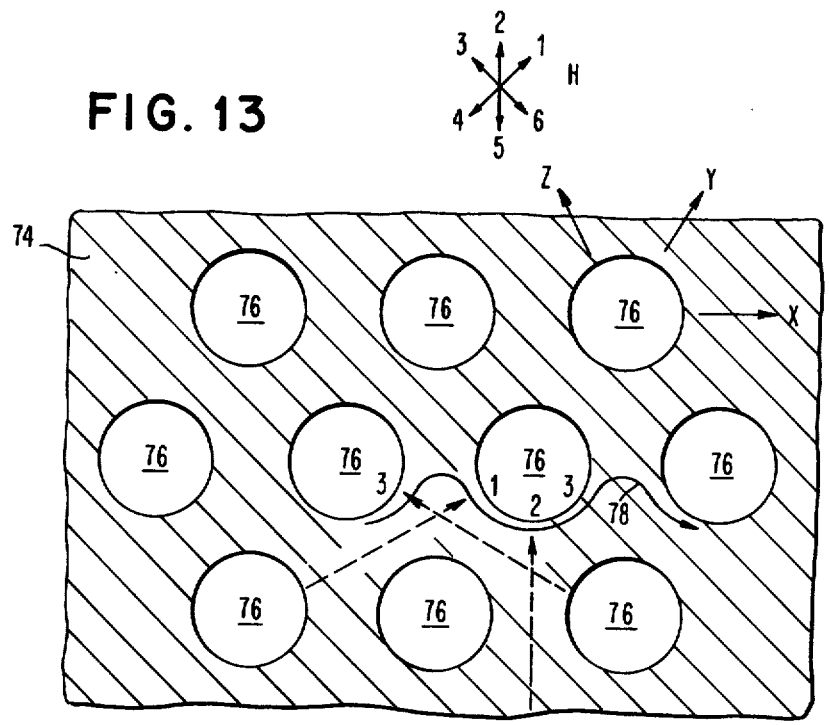
FIG. 13, including 13A, shows another propagation circuit which can be used to move bubble domains in two directions in response to reorienting field H.
FIG. 13A shows the direction of bubble domain movement by the structure of FIG. 13, in response to different sequences of field H.

While two-dimensional bubble domain motion can be achieved as described hereinabove using gapped magnetic propagation elements, it is also conceivable to provide such motion with contiguous disk-like propagation elements. The structures presented in FIGS. 11, 12 and 13 show alternate two-dimensional shift registers and compressors which are implemented using gapless propagation elements.

In general, the propagation elements are comprised of either ion implanted regions of a magnetic layer (including the bubble domain film) or an apertured magnetic layer, such as NiFe, or another material having in-plane magnetization. Bubble domains move in continuous magnetic paths in two dimensions by controlling the sequence of the magnetic drive field H in the plane of the propagation pattern.

Figure 11:
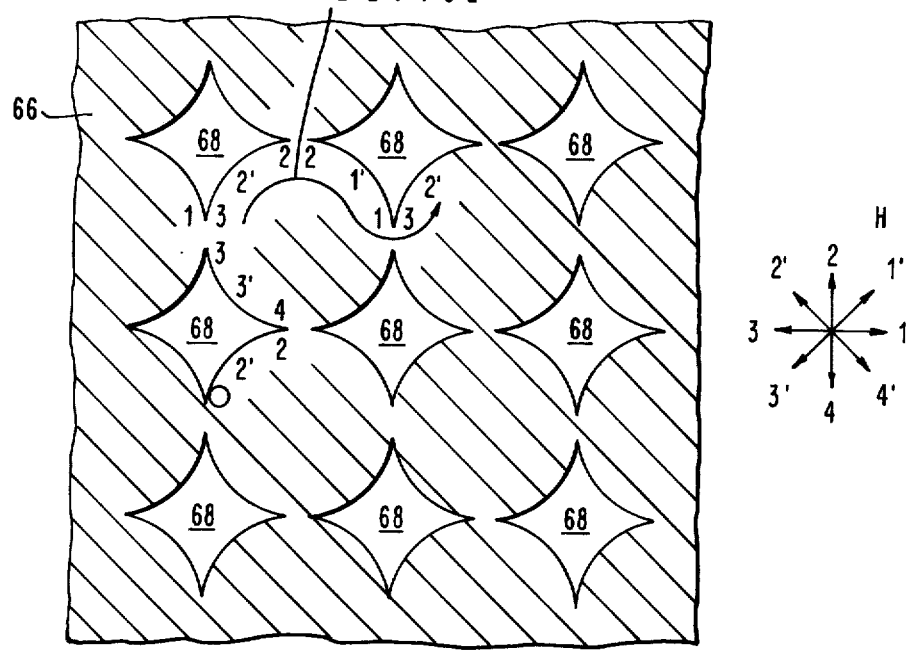
FIG. 11, including 11A, shows another bubble domain propagation structure for moving bubble domains in two dimensions in response to the reorientation of field H.

In FIG. 11, the magnetic pattern is comprised of cross-hatched regions 66. These regions are either a magnetically soft material such as NiFe or ion implanted regions of the magnetic layer such as the bubble domain film. Note that the cross-hatched area presents no air gap to the bubbles in motion. This pattern defines "diamond-like" regions 68 which are either apertures in the magnetic layer 66 or regions of the film 66 which are not ion implanted. Bubble domains B propagate along the edges of the region 68 as magnetic field H reorients in the plane of medium 66. The direction of bubble motion for the field sequence 2'2 1'1 3 2' is indicated in FIG. 11.

FIG. 11A shows the direction of bubble domain motion for various field sequences of applied field H. From this FIG., it is apparent that the structure of FIG. 11 can be used to move bubble domains in two dimensions in accordance with the field sequence that is chosen.

FIG. 12 shows a two-dimensional bubble domain compressor in which the cross-hatched regions 70 are portions of a magnetic layer having in-plane magnetization. Regions 70 can either be ion implanted regions of a magnetic layer such as the bubble domain film, or regions of a magnetically soft material such as NiFe. The octagonal regions 72 are regions which do not have in-plane magnetization. If the propagation structure 70 is a magnetically soft layer, then regions 72 are apertures in that layer. If regions 70 are ion implanted portions of a magnetic layer, then regions 72 are non-ion implanted regions of that layer. Regions 72 are generally square with concave rounded corners as shown here. A combination of four regions 72 is used to define a bubble domain idler. This idler is designed so that the field sequence (H) used to move bubble domains in other portions of the circuitry will cause bubble domains in the idlers to remain in their individual idler cells. For example, the path of a bubble domain for a field sequence 2'2 1'1 32' is shown in FIG. 12. Referring back to FIG. 11A, it is seen that that same field sequence will cause bubble domain motion to the right in the propagation structure of FIG. 11. (If the structure of FIG. 12 is to be used for propagation in the x direction instead of idling, the field sequence would be 2'2 1'1 2 3 2' . . . .) Consequently, the storage areas S1-S4 can have the propagation structure of FIG. 11, while the compressor regions C1-C4 can utilize structures such as that shown in FIG. 12. Thus, a fully loaded shift register of idlers acts as a compressor in the sense that when a bubble is injected at one end, another bubble will be ejected at the other end.

FIG. 13 shows a structure which will provide a triangular grid pattern of motion. Such patterns are shown in FIG. 13A, which illustrate the direction of motion for various field sequences.

In FIG. 13, the cross-hatched regions 74 are comprised of magnetic material having in-plane magnetization. As with the previous embodiments shown in FIGS. 11 and 12, regions 74 can be comprised of a magnetically soft layer having in-plane magnetization (such as NiFe) or ion implanted regions of a magnetic film. Regions 76 are circular in shape and are apertures in the magnetically soft layer in the case where regions 74 are comprised of magnetically soft material. If regions 74 are ion implanted regions of a magnetic film, then circular regions 76 are non-ion implanted portions of that magnetic layer.

Bubble domains propagate around the circular regions 76 as field H reorients in the plane of the magnetic layer. For example, bubble domains B will move in the direction of the curved arrow 78 for a field sequence 3 1 2 3, etc.

In contrast with prior art 2D shift registers using square or circular magnetic disks, the structures of FIGS. 11, 12, 13 retain bubbles below in-plane magnetic material at all times so that the bubbles are less prone to become hard bubbles. Further, the structures shown here can be used to implement compressor action, in contrast to the aforesaid prior art 2D shift registers.

What has been shown in a two-dimensional storage system wherein information can be rapidly accessed in two dimensions. This has usefulness in two-dimensional storage of information and pattern processing. Other applications include matrix multiplication and array storage where records can be arranged closely together in two-dimensional space.

In this system, sensors are distributed to allow the detection of data streams in x and y directions and means are provided for facilitating sharing of interconnections and circuits.

Although several embodiments have been shown, those of skill in the art will be able to design other embodiments using the principles of this invention.

What is claimed is:

1. A bubble domain storage system for moving magnetic bubble domains in a magnetic film, comprising:
    a plurality of storage arrays for storing bubble domains in said magnetic film arranged along x and y directions, each storage array being comprised of bi-directional shift registers for moving bubble domains in x and y directions, said shift registers being comprised of magnetic elements for moving said bubble domains in said x and y directions, wherein the magnetic elements have geometries such that bubble domains will move along them in either the x-direction or the y-direction depending upon the reorientation sequence of a magnetic field substantially in the plane of the magnetic elements,
    magnetic translation means located between said storage arrays, said translation means including compressor circuits aligned with said shift registers for translating information in any of said shift registers to an aligned shift register in an adjacent storage array,
    detection means for detecting bubble domains in said shift registers, said detection means comprising bubble domain sensing elements located between said storage arrays and disposed along said x and y directions for detection of bubble domains moving in said x and y directions.

2. The system of claim 1, including means for interconnecting said sensing elements in an x and y matrix for coincident selection of selected sensing elements.

3. The system of claim 1, including means for clearing information from selected shift registers and means for writing information into selected registers, said clearing means and said writing means being distributed along said x and y directions.

4. The system of claim 3, where said detection means includes means for amplifying the signal obtained when said bubble domains are detected.

5. The system of claim 4, where said ammplifying means is a compressor/sensor for detecting bubble domains.

6. The system of claim 4, where said shift registers are comprised of contiguous propagation elements forming propagation patterns for moving bubble domains in said x and y directions, in response to the reorientation of a magnetic field substantially in the plane of said patterns.

7. A bubble domain storage system, comprising:
a magnetic film in which said bubbles can be moved,
a plurality of storage arrays containing means for moving bubble domains along x and y directions in each said storage array, where said storage arrays are located on the same magnetic layer in which the bubble domains move,
magnetic translation means located between each of said storage arrays for translating information in said magnetic layer from any storage array to an adjacent storage array, said translation means including means for moving said bubble domains along x and y directions with the same data rate,
functional components located between any four of said storage arrays and shared by said four storage arrays, said functional components including detection means for detecting bubble domains moving in said x and y dimensions, clear means for selectively removing bubble domains, and write means for selectively writing information into a selected storage array,
means for moving bubble domains in any of said four storage arrays to said shared functional components.

8. The system of claim 7, where each said storage array is comprised of a plurality of bi-directional shift registers arranged along the x and y directions, and said translation means includes compressor circuits aligned with said shift registers.

9. The system of claim 8, where said shift registers and said compressors are comprised of magnetic elements for moving bubble domains in response to the reorientation of a magnetic field substantially in the plane of said magnetic elements.

10. The system of claim 9, where said magnetic elements are contiguous to one another.

11. The system of claim 9, where said detection means is comprised of sensing elements disposed along x and y directions for detection of domains moving in x and y directions, said sensing elements being connected in a coincident selection scheme.

12. The system of claim 9, wherein at least one pair of bubble domain sensing elements is provided between each four storage arrays.

13. The system of claim 9, where each said sensing element includes means for amplifying the signal from detected bubble domains.

14. A magnetic bubble domain storage system, comprising:
a magnetic layer in which said bubble domains can be moved,
a plurality of storage arrays for movement of bubble domains in said magnetic layer in response to the reorientation of a magnetic field substantially in the plane of said magnetic layer, each of said storage arrays containing contiguous magnetic elements arranged in registers for moving bubble domains in x and y directions in accordance with the reorientation sequence of said magnetic field,
magnetic translation means located between each of said storage arrays for translating information in said magnetic layer from any storage array to an adjacent storage array, said translation means including means for rapidly transferring bubble domains from a selected shift register in one storage array to an aligned shift register in an adjacent storage array, said shift register in said adjacent storage array being aligned with said selected register,
read, write, and clear circuits for reading information, writing information, and clearing information, said read, write, and clear circuits being located in a functional area located between any four of said storage arrays and being shared by said four storage arrays, said read circuit including detection means disposed along the x and y directions for detection of magnetic bubble domains moving in said x and y directions,
means for moving bubble domains in any of said four storage arrays to said shared read, write, and clear circuits, said read, write, and clear circuits being adjacent to said magnetic layer.

15. The storage system of claim 14, wherein said registers are comprised of magnetic elements, wherein said magnetic elements have geometries such that they will move bubble domains along said x and y directions depending upon the reorientation sequence of said magnetic field.

16. The magnetic bubble domain storage system, comprising:
a magnetic layer in which said bubble domains can be moved,
a plurality of storage arrays for storing information in said magnetic layer, each said storage array being separate from the other storage arrays where said storage arrays are arranged in rows and columns along x and y directions,
means interconnecting said storage arrays for movement of bubble domains from one storage array to an adjacent storage array, said means for interconnecting including means for translating said bubble domains in x and y directions between adjacent storage arrays,
functional components located between any four of said storage arrays and shared by said four storage arrays, said functional components including detection means for detecting bubble domains moving in said x and y directions, clear means for selectively removing bubble domains from storage, and write means for selectively writing information into a selected storage array,
transfer means for moving bubble domains in any of said four storage arrays to said shared functional components, there being a plurality of said functional comonents distributed throughout said bubble domain storage system wherein bubble domains in any storage array need move a distance not in excess of half of the width of the storage array to arrive at said transfer means.

17. The storage system of claim 16, wherein each of said storage arrays contains registers for moving magnetic bubble domains in both directions in x and y dimensions, said registers being comprised of contiguous propagation elements.

* * * * *